US012712335B1

(12) United States Patent
Albrecht et al.

(10) Patent No.: US 12,712,335 B1
(45) Date of Patent: Aug. 18, 2026

(54) LOW QUANTUM-DEFECT INTRA-CAVITY-PUMPED SEMICONDUCTOR DISK LASERS

(71) Applicant: UNM RAINFOREST INNOVATIONS, Albuquerque, NM (US)

(72) Inventors: Alexander Robert Albrecht, Albuquerque, NM (US); Mansoor Sheik-Bahae, Albuquerque, NM (US)

(*) Notice: Subject to any disclaimer, the term of this patent is extended or adjusted under 35 U.S.C. 154(b) by 777 days.

(21) Appl. No.: 17/872,582

(22) Filed: Jul. 25, 2022

Related U.S. Application Data

(60) Provisional application No. 63/225,744, filed on Jul. 26, 2021.

(51) Int. Cl.
*H01S 5/14* (2006.01)
*H01S 5/04* (2006.01)
*H01S 5/183* (2006.01)

(52) U.S. Cl.
CPC ................ *H01S 5/041* (2013.01); *H01S 5/14* (2013.01); *H01S 5/183* (2013.01)

(58) Field of Classification Search
CPC ............... H01S 5/041; H01S 5/14–148; H01S 5/18–187; H01S 5/1025
See application file for complete search history.

(56) References Cited

U.S. PATENT DOCUMENTS 6,285,702 B1 * 9/2001 Caprara .................. H01S 5/141 372/92
6,643,305 B2 * 11/2003 Bewley ................... H01S 5/041 372/45.01
6,714,574 B2 * 3/2004 Clayton .................. H01S 5/041 372/75
7,486,714 B2 * 2/2009 Lee ......................... H01S 5/026 372/71
7,653,113 B2 * 1/2010 Lee ......................... H01S 5/041 372/71
7,756,172 B2 * 7/2010 Giesen .................... H01S 5/183 372/50.1
7,817,700 B2 * 10/2010 Miyamae ................ H01S 5/423 372/50.12
8,351,479 B2 * 1/2013 Lutgen .................... H01S 5/041 372/70
8,824,518 B2 * 9/2014 Trankle ................. H01S 5/4025 372/72
2005/0152415 A1 * 7/2005 Giesen .................... H01S 5/183 372/34

(Continued)

OTHER PUBLICATIONS

Mateo et al. (Enhanced efficiency of AlGaInP disk laser by in-well pumping; Optical Society of America, vol. 23, No. 3, Jan. 2015) (Year: 2015).*

(Continued)

*Primary Examiner* — Tod T Van Roy

(74) *Attorney, Agent, or Firm* — MH2 Technology Law Group LLP

(57) ABSTRACT

An intra-cavity-pumped semiconductor disk laser (ICP-SDL) is disclosed that includes a laser cavity bounded at a first laser cavity end by a first reflective member and at a second laser cavity end by a first partially reflective member; and a membrane external-cavity surface-emitting laser (MECSEL) arranged within the laser cavity between the first end and the second end.

20 Claims, 7 Drawing Sheets

(56) References Cited

U.S. PATENT DOCUMENTS

| | | | | |
|---|---|---|---|---|
| 2005/0226302 | A1* | 10/2005 | Lutgen | H01S 5/1835 372/50.1 |
| 2007/0160102 | A1* | 7/2007 | Brick | B82Y 20/00 372/50.124 |
| 2009/0225797 | A1* | 9/2009 | Kuhnelt | H01S 5/02325 372/99 |
| 2010/0329298 | A1* | 12/2010 | Weichmann | H01S 3/0627 372/68 |
| 2013/0028279 | A1* | 1/2013 | Iakovlev | H01S 5/02484 372/36 |
| 2022/0209487 | A1* | 6/2022 | Luo | H01S 3/108 |
| 2025/0273921 | A1* | 8/2025 | Hessenius | H01S 3/108 |

OTHER PUBLICATIONS

Phung et al. (Power scaling and thermal lensing in 825nm emitting membrane external cavity surface emitting lasers; Optics letters, vol. 45, No. 2, Jan. 2020) (Year: 2020).*

Priante et al. (In-well pumping of a membrane externa-cavity surface-emitting laser; IEEE Journal of selected topics in quantum electronics; vol. 28, No. 1, Jan. 2022) (Year: 2022).*

Priante et al. (Demonstration of a 20-W membrane external cavity surface emitting laser for Sodium guide star applications; Electronic Letters, vol. 57, No. 8, Apr. 2021) (Year: 2021).*

Yang et al. (Optically pumped DBR-free semiconductor disk laser; Optical Society of America, vol. 23, No. 26, Dec. 2015) (Year: 2015).*

* cited by examiner

600
VECSEL or
H-MECSEL
602
Pump gain medium
606
604
608
Laser output 620
622
Pump gain medium
626
VECSEL or
H-MECSEL
628
624
630
Laser output 640
VECSEL or
H-MECSEL
642
644
Pump gain medium
648
646
650
652
Laser output 660
VECSEL or
H-MECSEL
662
664
666
668 Pump VECSEL
670 Pump VECSEL
672
674
Laser output

LOW QUANTUM-DEFECT INTRA-CAVITY-PUMPED SEMICONDUCTOR DISK LASERS

CROSS-REFERENCE TO RELATED APPLICATIONS

This application claims priority to U.S. Provisional Patent Application Ser. No. 63/225,744, filed Jul. 26, 2021, the entirety of which is incorporated herein by reference.

GOVERNMENT RIGHTS

This disclosure was made with Government support under Contract No. FA9550-16-1-0362 awarded by the Air Force Office of Scientific Research (AFOSR). The Government has certain rights in the invention.

TECHNICAL FIELD

Embodiments described herein relate generally to optically pumped semiconductor lasers, particularly to low quantum defect intra-cavity pumped semiconductor disk lasers.

BACKGROUND

Vertical-external-cavity surface-emitting lasers (VECSELs) or semiconductor disk lasers (SDLs), have established themselves as high-power, good beam quality sources for a variety of applications, as they can be designed to operate over a large wavelength range, not easily accessible by other technologies. However, the output power of VECSELs has been limited to ~100 W, compared to several kW from fiber and disk lasers. The main limiting factor is thermal management. FIG. 1 shows a conventional VECSEL that typically comprises a semiconductor active region—commonly quantum wells (QWs) 105—on top of a distributed Bragg reflector (DBR) 110, a heat spreader (diamond 115), and a heat sink 120 inside an external cavity (laser cavity) formed by optical element 125. A laser source (laser diode 130) is directed onto the semiconductor active region by focusing optical element 135. The DBR 110 is formed by alternating layers of high and low index of refraction semiconductors, often in excess of 20 pairs and 5 microns in thickness, to reach the required reflectivity values. This thickness and large number of material interfaces causes a high thermal resistance in the DBR 110, leading the active region to overheat, ultimately limiting the output power. FIG. 2 shows a conventional DBR-free SDLs, or membrane external-cavity surface-emitting lasers (MECSELs) that removes the need for DBR and the thermal limitations of the DBR.

FIG. 3A and FIG. 3B show a conventional Hybrid-MECSEL (H-MECSEL) and heat sink setup for (FIG. 3A) single and (FIG. 3B) dual heat spreader configurations, schematically showing the improved heat flow in the devices. Thermal contact between heat spreader/mirror and heat sink can be improved by soldering or intermediate layers of soft, high thermal conductivity materials like heat sink compound or indium foil. As described in disclosure [Sheik-Bahae 2020, Hybrid Membrane External-Cavity Surface-Emitting Laser" U.S. application Ser. No. 17/546,142], a mirror (e.g. DBR) is attached on the back side of the MECSEL heat spreader (FIG. 3A and FIG. 3B), allowing a similar cavity design as a regular VECSEL (FIG. 1), but without the drawbacks in thermal conductivity. Any pump absorption in the mirror could still cause heating, but the mirror is directly attached to the heat sink and would thus not contribute to heating of the active region.

In-well pumping, where the pump laser is absorbed in the QWs of the SDL gain chip, rather than in the barrier layers surrounding the QWs, can significantly reduce the amount of heating in an SDL, as the difference between the pump wavelength and the emission wavelength (the so-called quantum defect) is smaller, resulting in less heating and potentially higher output powers. Since the absorption is much lower for in-well pumping, a complicated multi-pass pumping setup is usually required (FIG. 4). FIG. 4 shows a multi-pass pumping setup for the case of the H-MECSEL using a parabolic mirror (with hole at the center) and pair of flat mirrors to shift the beam, resulting in multiple pump passes through the gain chip.

SUMMARY

According to examples of the present disclosure, an intra-cavity-pumped semiconductor disk laser (ICP-SDL) is disclosed. The ICP-SDL comprises a laser cavity bounded at a first laser cavity end by a first reflective member and at a second laser cavity end by a first partially reflective member; and a membrane external-cavity surface-emitting laser (MECSEL) arranged within the laser cavity between the first end and the second end.

Various additional features can be included in the ICP-SDL including one or more of the following features. The ICP-SDL can further comprise a pump laser comprising a pump cavity arranged to pump the MECSEL and a pump gain medium. The pump cavity is bounded at a first pump cavity end by a second reflective member and at a second pump cavity end by a third reflective member. The pump cavity is arranged at an angle to the laser cavity. The pump cavity is arranged at a common axis to the laser cavity. The second reflective member is arranged outside and along a common axis to the laser cavity. A pump wavelength of a pump laser beam emitted by the pump laser is determined based on a gain medium of the MECSEL. The gain medium of the MECSEL comprises quantum wells, quantum dots, or bulk semiconductor material or alloy. The pump laser comprises a rare-earth doped solid-state laser, an external-cavity laser, a semiconductor disk laser, or a gas laser. The rare-earth doped solid-state laser comprises a Nd:YAG, Yb:YAG, or a Nd:$YVO_4$.

According to examples of the present disclosure, a method of lasing using an intra-cavity-pumped semiconductor disk laser (ICP-SDL) is disclosed. The method comprises pumping a membrane external-cavity surface-emitting laser (MECSEL) arranged within a laser cavity using a pump laser, wherein the laser cavity is bounded at a first laser cavity end by a first reflective member and at a second laser cavity end by a first partially reflective member.

Various additional features can be included in the method including one or more of the following features. The pump laser comprising a pump cavity arranged to pump the MECSEL and a pump gain medium. The pump cavity is bounded at a first pump cavity end by a second reflective member and at a second pump cavity end by a third reflective member. The pump cavity is arranged at an angle to the laser cavity. The pump cavity is arranged at a common axis to the laser cavity. The second reflective member is arranged outside and along a common axis to the laser cavity. A pump wavelength of a pump laser beam emitted by the pump laser is determined based on a gain medium of the MECSEL. The gain medium of the MECSEL comprises quantum wells, quantum dots, or bulk semiconductor material or alloy. The pump laser comprises a rare-earth doped solid state laser, an external-cavity laser, a semiconductor disk laser, or a gas laser. The rare-earth doped solid-state laser comprises a Nd:YAG, Yb:YAG, or a $Nd:YVO_4$.

Additional advantages of the embodiments will be set forth in part in the description which follows, and in part will be understood from the description, or may be learned by practice of the embodiments. The advantages will be realized and attained by means of the elements and combinations particularly pointed out in the appended claims.

It is to be understood that both the foregoing general description and the following detailed description are exemplary and explanatory only and are not restrictive of the embodiments, as claimed.

BRIEF DESCRIPTION OF THE DRAWINGS

The accompanying drawings, which are incorporated in and constitute a part of this specification, illustrate embodiments of the present teachings and together with the description, serve to explain the principles of the disclosure.

FIG. 5A shows separate pump and laser cavities, FIG. 5B shows shared pump and laser cavities, requiring broad- or dual-band mirrors and a pump gain medium that is transparent at the lasing wavelength, and FIG. 5C shows an extended cavity, with the inner mirror transparent for the pump but reflective for the laser wavelength.

FIG. 6A shows a shared cavity, assuming dual-band DBR and pump gain medium transparent at lasing wavelength, FIG. 6B shows an extended cavity, with the DBR or H-MECSEL mirror transparent for the pump but reflective for the laser wavelength, FIG. 6C shows separate cavities, using dual-band DBR, and FIG. 6D shows separate cavities, using multiple pump gain elements, in this example VECSELs.

DESCRIPTION OF THE EMBODIMENTS

Figure 1:
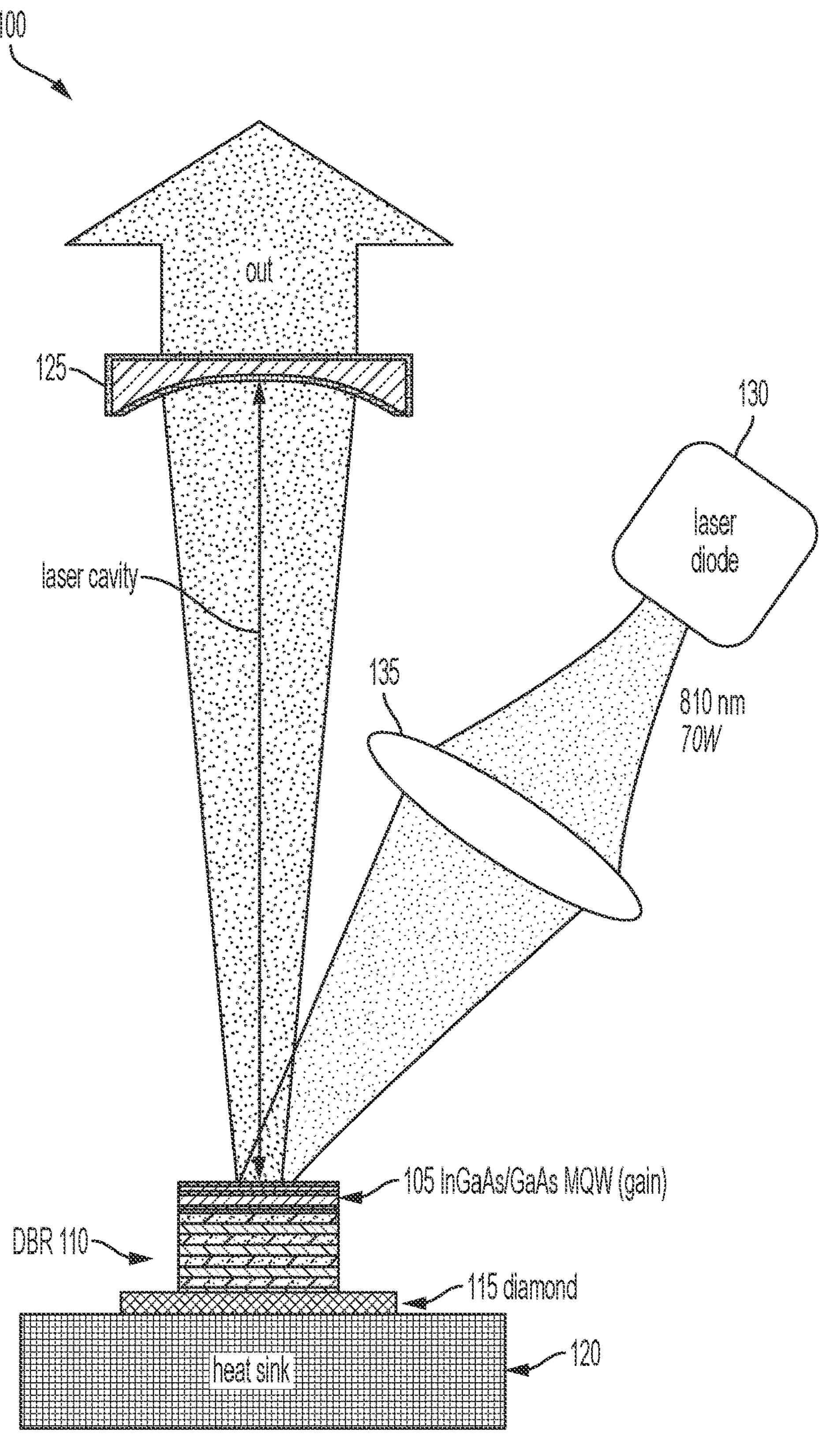
FIG. 1 shows a conventional VECSEL setup.
Figure 2:
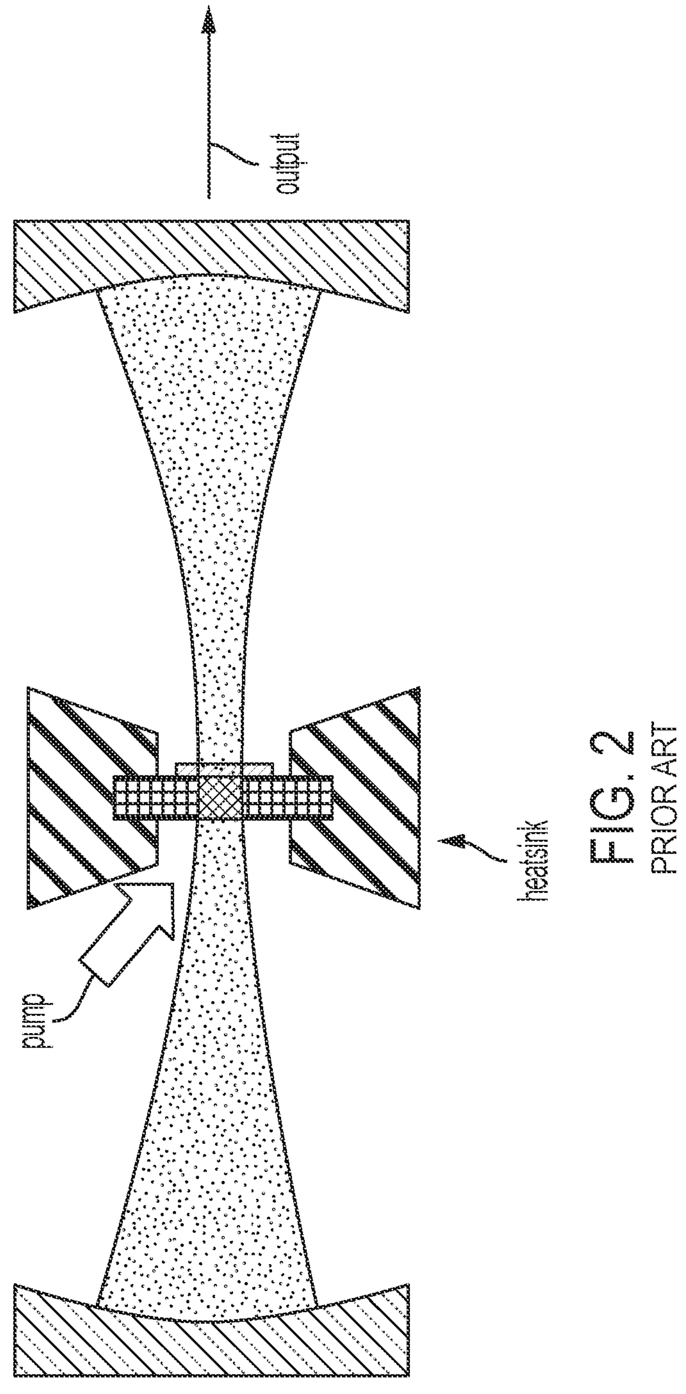
FIG. 2 shows a conventional DBR-free SDL setup.
Figure 3A:
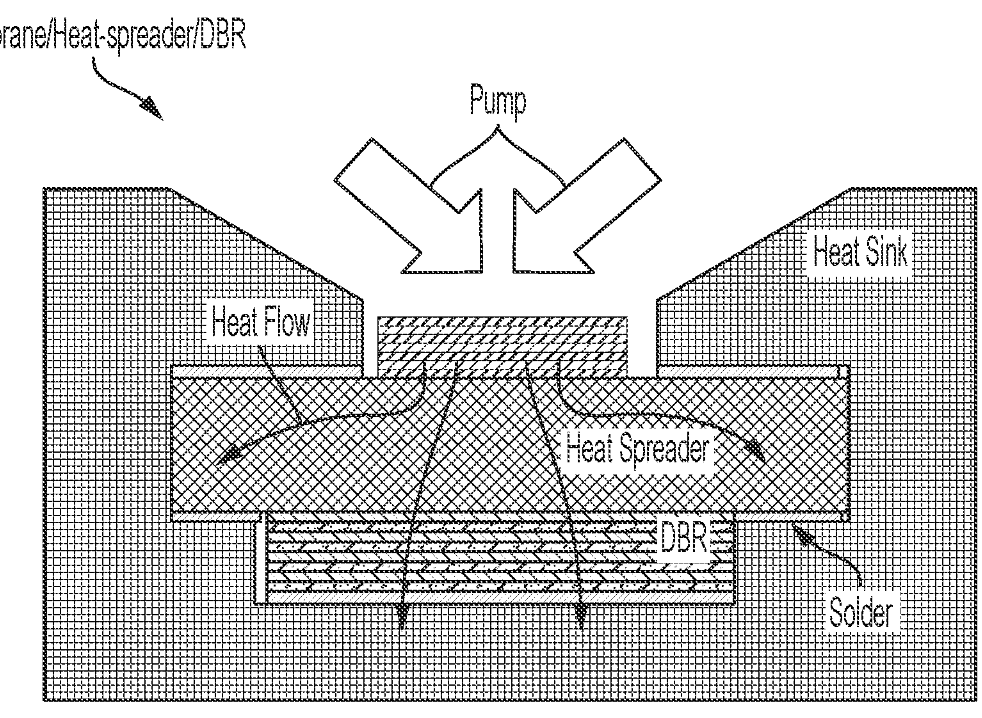
FIG. 3A and FIG. 3B shows a conventional H-MECSEL and heat sink setup for (FIG. 3A) single and (FIG. 3B) dual heat spreader configurations, schematically showing the improved heat flow in the devices according to examples of the present disclosure. Thermal contact between heat spreader/mirror and heat sink can be improved by soldering or intermediate layers of soft, high thermal conductivity materials like heat sink compound or indium foil.
Figure 3B:
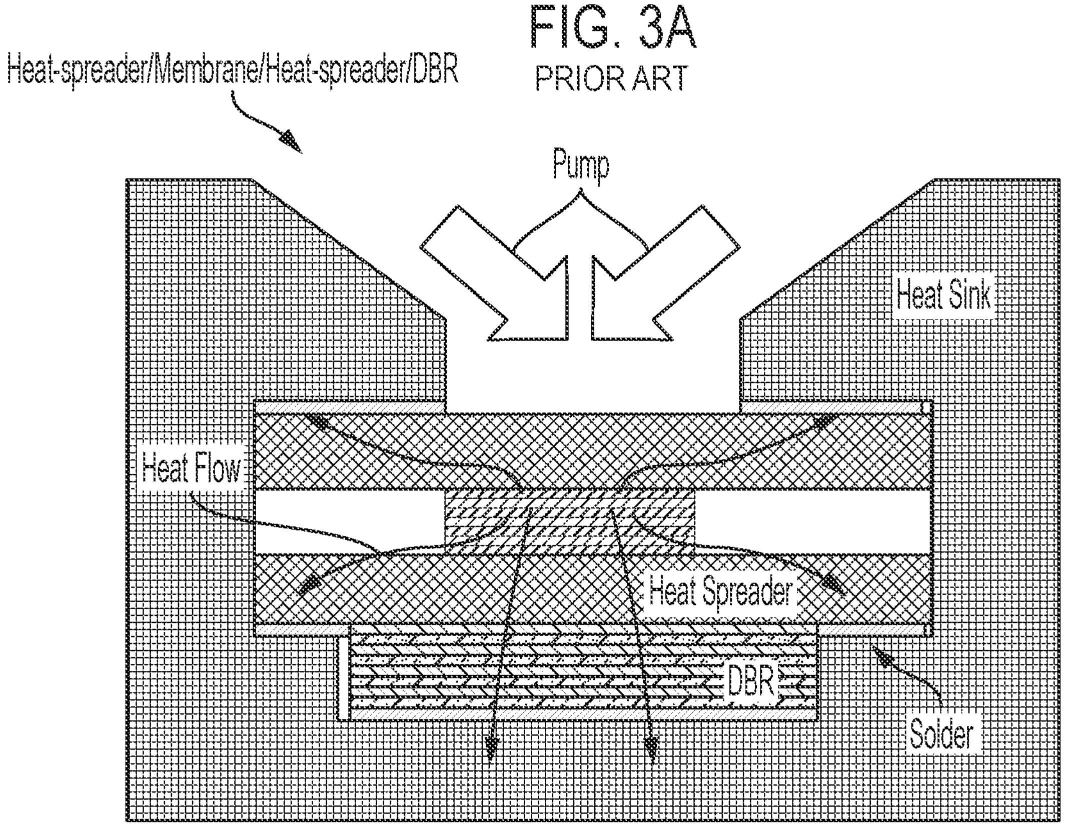
Figure 4:
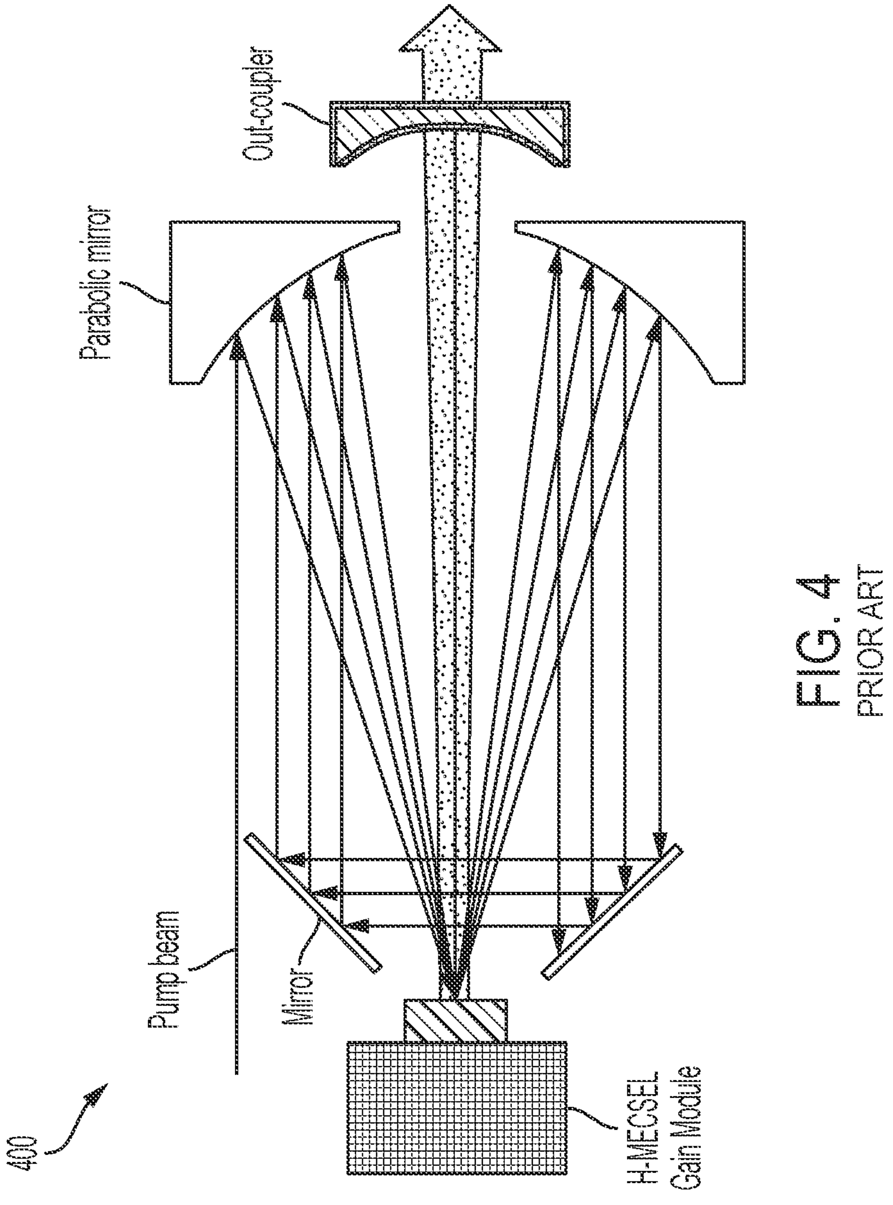
FIG. 4 shows a conventional multi-pass pumping setup for the case of the H-MECSEL using a parabolic mirror (with hole at the center) and pair of flat mirrors to shift the beam, resulting in multiple pump passes through the gain chip.

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the embodiments are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g., −1, −2, −3, −10, −20, −30, etc.

The following embodiments are described for illustrative purposes only with reference to the figures. Those of skill in the art will appreciate that the following description is exemplary in nature, and that various modifications to the parameters set forth herein could be made without departing from the scope of the present embodiments. It is intended that the specification and examples be considered as examples only. The various embodiments are not necessarily mutually exclusive, as some embodiments can be combined with one or more other embodiments to form new embodiments. It will be understood that the structures depicted in the figures may include additional features not depicted for simplicity, while depicted structures may be removed or modified.

Generally speaking, examples of the present disclosure provide for a laser architecture to facilitate low-quantum defect (such as in-well pumping) of a semiconductor disk laser (VECSEL or MECSEL) without the need for a complex multi-pass pumping scheme, and in particular, an Intra-Cavity-Pumped Semiconductor Disk Laser (ICP-SDL). To facilitate low quantum-defect or in-well pumping without the need for complex multi-pass pumping optics, the present approach instead places the SDL to be pumped inside the cavity of the pump laser. By making use of the high circulating intra-cavity power of the pump laser, sufficient pump power can be absorbed in the SDL.

As described in co-pending U.S. patent application Ser. No. 17/546,142 filed on Dec. 9, 2021, which is commonly owned with the present application and is hereby incorporated by reference in its entirety, a H-MECSEL comprises gain structure, such as a semiconductor active gain structure. Gain structure comprises top active gain surface and bottom active gain surface. In some examples, gain structure comprises a semiconductor active gain structure comprising multiple quantum wells. In some examples, the semiconductor active gain structure comprises one or more quantum wells and/or one or more quantum well materials. In some examples, the semiconductor active gain structure comprises alternating layers of InGaAs/GaAs. In some examples, gain structure can be composed of a bulk semiconductor material could be used. The material or material combination of gain structure depends on the desired pump laser and H-MECSEL emission wavelengths. In some examples, gain structure 405 can have a thickness of about ~2 μm.

In some examples, gain structure can be formed as follows. The sample is grown on GaAs substrate. The sample comprises GaAs, with InGaAs quantum wells as the gain medium. For UV and visible applications, GaN/InGaN can be used. For red to near-IR, GaInP quantum wells, surrounded by AlGaInP on GaAs substrate can be used. For longer wavelengths in the IR, InP or GaSb substrates with various QW materials can be used.

H-MECSEL further comprises first heat spreading structure. First heat spreading structure comprises top first heat spreading structure surface and bottom first heat spreading structure surface. Top first heat spreading structure surface is in thermal contact with bottom active gain surface.

H-MECSEL further comprises reflecting structure. Reflecting structure comprising top reflecting structure surface and bottom reflecting structure surface. Top reflecting structure surface is in contact with bottom first heat spreading structure. Reflecting structure can comprise a semiconductor distributed Bragg reflector, a dielectric stack, a metal, or combinations thereof. Reflecting structure can be a dual band reflecting structure (reflecting pump and laser wavelengths), single band reflecting structure (reflecting laser), or a reflecting laser structure with a high transmission at pump wavelength. In some examples, reflecting structure can cover some or all of first heat spreading structure.

In some examples, reflecting structure can be formed on bottom first heat spreading structure as follows. For example, reflecting structure, such as a semiconductor DBR, can be formed on bottom first heat spreading structure by bonding an epitaxially grown semiconductor DBR to first heat spreading structure. Since the main part of the heat flow from gain structure to heat sink does not pass through DBR, low thermal conductivity is no longer a significant issue. Also, in case reflecting structure absorbs any of the transmitted pump light, that heat generated can directly be transferred to heat sink, without significantly increasing gain structure temperature. Alternately, reflecting structure, such as a dielectric mirror, can be directly coated onto bottom first heat spreading structure, which may have even lower thermal conductivity. However, this would not be a problem in this configuration. The dielectric coating would be less likely to absorb a significant amount of pump light either. In yet another alternative, for longer wavelength devices (mid-IR), reflecting structure can be a metallic mirror coating, such as, but is not limited to, aluminum, silver, or gold. These would even have good thermal conductivity and may assist with cooling of bottom first heat spreading structure.

H-MECSEL can further optionally comprise second heat spreading structure. Second heat spreading structure comprises top second heat spreading structure surface and bottom second heat spreading structure surface. Bottom second heat spreading structure surface is in thermal contact with top active gain surface. In some examples, first heat spreading structure, second heat spreading structure, or both can be about 0.1 to about 2.0 mm thick. In some examples, first heat spreading structure, second heat spreading structure, or both is composed of SiC, sapphire, or diamond.

In some examples, first heat spreading structure and second heat spreading structure are composed of materials that have good optical quality (low absorption, low scattering, and high transparency at the laser and pump wavelengths), high thermal conductivity, mechanical/chemical stability and good surface quality (for bonding/adhesion). In the visible and near-IR, the most common material choices would be diamond (highest thermal conductivity), SiC (very good thermal conductivity, good optical quality, much cheaper than diamond), and Sapphire (lower thermal conductivity, very good surface and optical quality). Other materials can be used as well, e.g. Magnesium Fluoride. For longer wavelength operation, the materials can include, but are not limited to, GaAs, InP, or Si.

In some examples, the thickness of first heat spreading structure and second heat spreading structure can be somewhat flexible. For example, the thickness is thick enough to have enough mechanical stability for bonding and mounting. For example, a lower limit for the thickness can be about ~0.1 mm. In terms of thermal performance, a thicker heat spreader is usually better. However, if the absorption in the heat spreader is too high, it may impact performance. For example, a typical thickness can be between about 0.25-1 mm. In some examples, if optical quality is good enough, or maybe at longer wavelength, a larger thickness can be used. For example, an upper limit of the thickness can be about 10 mm.

H-MECSEL can further optionally comprise heat sink structure in thermal contact with first heat spreading structure and reflecting structure. H-MECSEL can further optionally comprise anti-reflective coating disposed on top second heat spreading structure or disposed on top active gain surface.

Since the SDL is placed inside the pump laser cavity, any laser with an external cavity could be used as a pump source. The pump wavelength is determined by the SDL gain medium, which could be quantum wells, quantum dots, or even a bulk semiconductor material or alloy. Examples of pump lasers are rare-earth doped solid-state lasers, such as Nd:YAG, Yb:YAG or Nd:$YVO_4$ (rod or disk), external-cavity diode or fiber lasers, another SDL, or even a gas laser. Depending on power requirements, multiple pump gain media could be used to pump one SDL, or multiple SDLs could be pumped by one pump laser. Several different implementations of the present approach are possible, depending on the type of SDL, the required pump wavelength, and the type and power of the pump laser to be used; some examples are briefly described below.

Figures 5A, 5B, 5C:
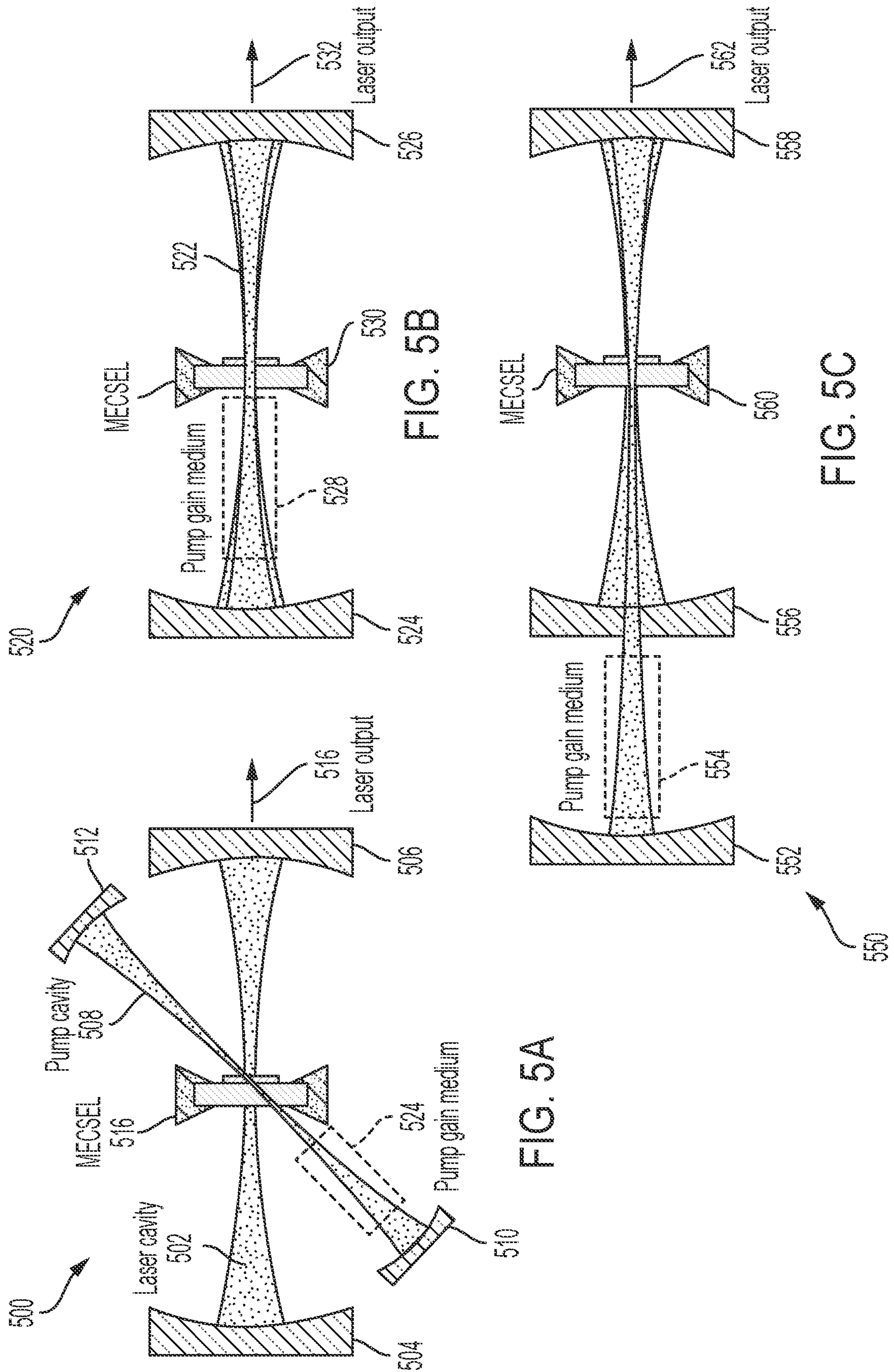
FIG. 5A, FIG. 5B, and FIG. 5C show examples for intra-cavity pumped (ICP) SDLs, assuming a rod-shaped solid state laser as pump medium according to examples of the present disclosure, where

MECSELs benefit most from this method, as multi-pass pumping usually requires a large number of optical elements due to the transmission geometry design. FIG. 5A, FIG. 5B, and FIG. 5C show examples for ICP-SDLs for pumping a MECSEL in transmission geometry, assuming a rod-shaped solid state laser as pump medium according to examples of the present disclosure, where FIG. 5A shows separate pump and laser cavities, FIG. 5B shows shared pump and laser cavities, requiring broad- or dual-band mirrors and a pump gain medium that is transparent at the lasing wavelength, and FIG. 5C shows an extended cavity, with the inner mirror transparent for the pump but reflective for the laser wavelength.

As shown in FIG. 5A, ICP-SDL 500 comprises laser cavity 502 that is formed by first reflective optical element 504, such as a first mirror, and second reflective optical element 506, such as a second mirror. MECSEL 516 is positioned, for example, at or near the middle of laser cavity 502. Second reflective optically element 506 is partially reflective and transmissible, such that laser output 516 is transmitted through second reflective optical element 506. Pump cavity 508 is arranged at an angle to laser cavity 502 such that the pump beam intersects MECSEL 516. Pump cavity 508 is formed by third reflective optical element 510, such as a third mirror, and fourth reflective optical element 512, such as a second mirror. The pumped beam is generated by pump gain medium 514 that is arranged within the pump cavity 508. In the various examples shown and described, the mirrors of the laser cavity can have the same radius of curvature on both sides. If, for example, a flat and a curved mirror is used, the MECSEL is positioned close to the flat mirror. Generally, the MECSEL is positioned inside the laser cavity.

As shown in FIG. 5B, ICP-SDL 520 comprises an aligned laser cavity and the pump cavity. The aligned laser and pump cavity is formed by first reflective optical element 524, such as a first mirror, and second reflective optical element 526, such as a second mirror. MECSEL 530 is positioned at or near the middle of the aligned laser and pump cavity. Second reflective optical element 526 is partially reflective and transmissible, such that laser output 532 is transmitted through second reflective optical element 526. Pump gain medium 528 is arranged at one side of MECSEL 530. The second reflective optical element 526 is partially reflective, for example greater than or equal to about 90% or more reflective, at the laser wavelength, for example at 1178 nm, and highly reflective, for example greater than or equal to about 99%, at the pump wavelength.

As shown in FIG. 5C, ICP-SDL 550 comprises an aligned laser cavity and the pump cavity. The laser cavity is formed by first reflective optical element 556, such as a first mirror, and second reflective optical element 558, such as a second mirror. MECSEL 560 is positioned at or near the middle of the laser cavity. Second reflective optically element 558 is partially reflective and transmissible, such that laser output 562 is transmitted through second reflective optical element 558. The pump cavity is formed by third reflective optical element 552, such as a third mirror, and second reflective optical element 558. The pumped beam is generated by pump gain medium 554 that is arranged between third reflective optical element 552 and first reflective optical element 556. The second partially reflective optical element 558 is partially reflective, for example greater than or equal to about 90% or more reflective, at the laser wavelength, for example at 1178 nm, and highly reflective, for example greater than or equal to about 99%, at the pump wavelength.

Figures 6A, 6B, 6C, 6D:
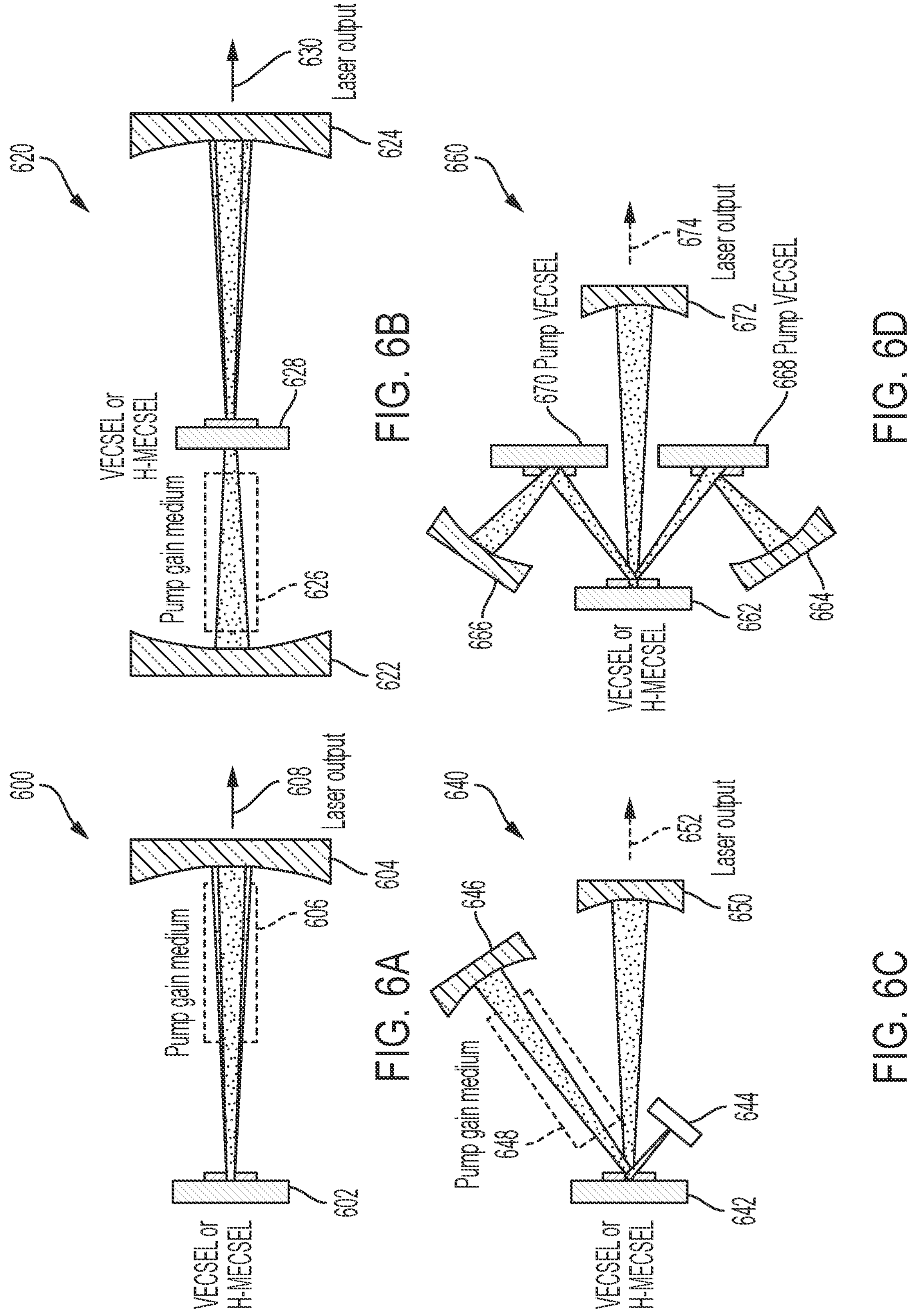
FIG. 6A, FIG. 6B, FIG. 6C, and FIG. 6D show examples for intra-cavity pumping of VECSELs or H-MECSELs, according to examples of the present disclosure, where

FIG. 6A, FIG. 6B, FIG. 6C, and FIG. 6D show examples for intra-cavity pumping of VECSELs or H-MECSELs, according to examples of the present disclosure, where FIG. 6A shows a shared cavity, assuming dual-band DBR and pump gain medium transparent at lasing wavelength, FIG. 6B shows an extended cavity, with the DBR or H-MECSEL mirror transparent for the pump but reflective for the laser wavelength, FIG. 6C shows separate cavities, using dual-band DBR, and FIG. 6D shows separate cavities, using multiple pump gain elements, in this example VECSELs.

As shown in FIG. 6A, intra-cavity pumping of VECSEL or H-MECSEL device 600 comprises an aligned laser cavity and the pump cavity. The aligned laser and pump cavity is formed by VECSEL or H-MECSEL 602 and partially reflective optical element 604, such as a partially reflective mirror. Pump gain medium 606 is arranged within the aligned laser cavity and pump cavity. Laser output 608 is transmitted through partially reflective optical element 604. The partially reflective optical element 604 is partially reflective, for example greater than or equal to about 90% or more reflective, at the laser wavelength, for example at 1178 nm, and highly reflective, for example greater than or equal to about 99%, at the pump wavelength.

As shown in FIG. 6B, intra-cavity pumping of VECSEL or H-MECSEL device 620 comprises an aligned laser cavity and the pump cavity. The pump portion of the aligned laser and pump cavity is formed by first reflective optical element 622 and second partially reflective optical element 624, such as a partially reflective mirror. The laser portion of the aligned laser and pump cavity is formed by VECSEL or H-MECSEL 628 and second partially reflective optical element 624. Pump gain medium 626 is arranged within the pump cavity and between first reflective optical element 622 and VECSEL or H-MECSEL 628. Laser output 630 is transmitted through second partially reflective optical element 624. The second partially reflective optical element 624 is partially reflective, for example greater than or equal to about 90% or more reflective, at the laser wavelength and highly reflective, for example greater than or equal to about 99%, at the pump wavelength.

As shown in FIG. 6C, intra-cavity pumping of VECSEL or H-MECSEL device 640 comprises an offset laser cavity and the pump cavity. The pump cavity comprises first reflective optical element 644 and second reflective optical element 646. The pump laser is incident on VECSEL or H-MECSEL 642 and is pumped by pump gain medium 648. The laser cavity is formed by VECSEL or H-MECSEL 642 and third partially reflective optical element 650. Laser output 652 is transmitted through third partially reflective optical element 650.

As shown in FIG. 6D, intra-cavity pumping of VECSEL or H-MECSEL device 660 comprises an offset laser cavity and the pump cavity. The pump cavity comprises first reflective optical element 664, first pump VECSEL 668, which directs the pump laser onto VECSEL or H-MECSEL 662, second VECSEL 670, and second reflective optical element 666. The laser cavity is formed by VECSEL or H-MECSEL 662 and third partially reflective optical element 672. Laser output 674 is transmitted through third partially reflective optical element 672.

In the various configurations for pumping a VECSEL or H-MECSEL as shown in FIG. 6A, FIG. 6B, FIG. 6C, and FIG. 6D, both broad- or dual-band mirrors or DBRs or pump-transparent mirrors can be used as reflective elements. In FIG. 6B, the VECSEL is bonded to a transparent heat spreader instead of the typical soldering. The configurations shown in FIG. 6A, FIG. 6B, FIG. 6C, and FIG. 6D are only non-limiting implementations, as there are a number of possible combinations of pump lasers and SDLs, depending on material choices, pump and laser wavelength, and the availability of mirrors or DBRs that can be used. The common element is to place the SDL(s) to be pumped inside the pump laser cavity (cavities), to remove the need for multi-pass pumping optics.

Figure 7:
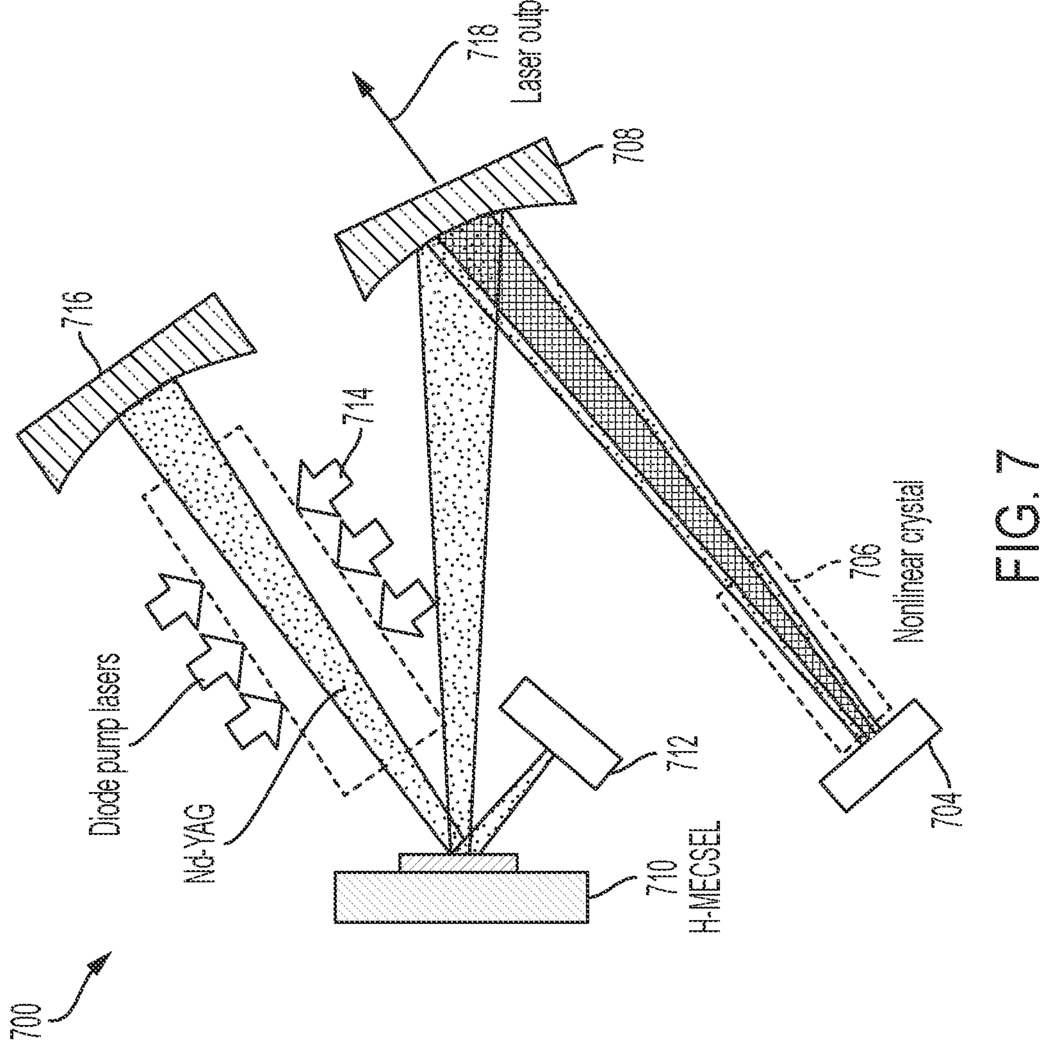
FIG. 7 shows one non-limiting application of examples of the present disclosure of a 1178 nm H-MECSEL, pumped by Nd:YAG module and intra-cavity frequency-doubled to 589 nm for sodium guidestar applications according to examples of the present disclosure.

FIG. 7 shows one non-limiting application of examples of the present disclosure of a 1178 nm H-MECSEL, pumped by Nd:YAG module and intra-cavity frequency-doubled to 589 nm for sodium guidestar applications according to examples of the present disclosure. One application of this technology is a sodium guidestar laser, constructed by intra-cavity pumping a 1178 nm H-MECSEL with a Nd:YAG (or $YVO_4$) diode-pumped gain module. The 1178 nm H-MECSEL is then intra-cavity frequency-doubled using a non-linear optical crystal to generate the 589 nm output.

As shown in FIG. 7, intra-cavity pumping of VECSEL or H-MECSEL device 700 comprises an offset laser cavity and the pump cavity. The pump cavity comprises first reflective optical element 712, which directs the pump laser onto VECSEL or H-MECSEL 710, and second reflective optical element 716. The pump laser is pumped using diode pump lasers 714, such as Nd:YAG. The laser cavity is formed by VECSEL or H-MECSEL 710, third partially reflective optical element 708, and fourth reflective optical element 704. Nonlinear crystal 706 is arranged in the laser path near the fourth reflective optical element 704. Laser output 718 is transmitted through third partially reflective optical element 708. The partially reflective optical element 708 is highly reflective, for example greater than or equal to about 99% or more reflective, at the laser wavelength, for example at 1178 nm, and highly transmissive, for example greater than or equal to about 99%, at the second harmonic, for example 589 nm.

In some examples, some of the above-discussed implementations can also be operated in pulsed mode. Many solid-state lasers, like Nd:YAG, can generate pulses with high peak power using Q-switching, where either an active modulator or a (passive) saturable absorber is placed inside the laser cavity and allows for energy to be built up in the gain medium and then released in a high-power pulse. Q-switching cannot be employed in semiconductor disk lasers, due to the low carrier lifetime that limits the amount of energy storage. Using the above-disclosed intra-cavity-pumped semiconductor disk lasers, a Q-switched pump laser can be used to pulse-pump the SDL, thereby creating high peak-power pulses. Thanks to the low quantum defect and the reduced pump duty cycle, the heat load on the SDL is significantly reduced, allowing higher peak output powers than during CW operation. While any actively or passively Q-switched pump laser, or even a pulse-pumped laser can be used, one possible implementation of this can use the SDL itself as the saturable absorber that would result in Q-switching of the pump laser, thereby significantly reducing the complexity of the whole system.

While the embodiments have been illustrated with respect to one or more implementations, alterations and/or modifications can be made to the illustrated examples without departing from the spirit and scope of the appended claims. In addition, while a particular feature of the embodiments may have been disclosed with respect to only one of several implementations, such feature may be combined with one or more other features of the other implementations as may be desired and advantageous for any given or particular function.

Furthermore, to the extent that the terms "including", "includes", "having", "has", "with", or variants thereof are used in either the detailed description and the claims, such terms are intended to be inclusive in a manner similar to the term "comprising." As used herein, the phrase "one or more of", for example, A, B, and C means any of the following: either A, B, or C alone; or combinations of two, such as A and B, B and C, and A and C; or combinations of three A, B and C.

Other embodiments will be apparent to those skilled in the art from consideration of the specification and practice of the descriptions disclosed herein. It is intended that the specification and examples be considered as exemplary only, with a true scope and spirit of the embodiments being indicated by the following claims.

What is claimed is:

1. An intra-cavity-pumped semiconductor disk laser (ICP-SDL) comprising:

a membrane external-cavity surface-emitting laser (MECSEL) comprising a MECSEL gain medium having a plane of the MECSEL gain medium that is orthogonal to a direction of a MECSEL resonator, bounded at a first resonator end by a first reflective member and at a second resonator end by a second reflective or partially reflective member; and an external pump laser resonator comprising a pump laser gain medium inside the external pump laser resonator bounded by a first external reflector and a second external reflector, wherein the MECSEL is arranged in the external pump laser resonator, wherein the external pump laser resonator is configured to optically pump the MECSEL, and wherein the external pump laser resonator is oriented so that the external pump laser resonator is not in the plane of the MECSEL gain medium.

2. The ICP-SDL of claim 1, wherein the external pump laser resonator is bounded at a first pump cavity end by a second reflective member and at a second pump cavity end by a third reflective member.

3. The ICP-SDL of claim 2, wherein the second reflective member is arranged outside and along a common axis to the MECSEL resonator.

4. The ICP-SDL of claim 1, wherein the external pump laser resonator is arranged at an angle to the MECSEL resonator.

5. The ICP-SDL of claim 1, wherein the external pump laser resonator is arranged at a common axis to the MECSEL resonator, wherein the first reflective member and the second reflective member are shared by the external pump laser resonator and the MECSEL resonator.

6. The ICP-SDL of claim 1, wherein a pump wavelength of a pump laser beam produced by the external pump laser resonator is determined based on the MECSEL gain medium.

7. The ICP-SDL of claim 6, wherein the MECSEL gain medium comprises quantum wells, quantum dots, or bulk semiconductor material or alloy.

8. The ICP-SDL of claim 1, wherein the external pump laser resonator comprises a rare-earth doped solid-state laser, an external-cavity laser, a semiconductor disk laser, or a gas laser.

9. The ICP-SDL of claim 8, wherein the external pump laser resonator comprises the rare-earth doped solid-state laser, and wherein the rare-earth doped solid state laser comprises a Nd:YAG, Yb:YAG, or a Nd:$YVO_4$.

10. The ICP-SDL of claim 1, wherein the external pump laser resonator is configured to pump the MECSEL in an orientation where all a pump laser beam is orthogonal to the plane of the MECSEL gain medium.

11. A method of lasing using an intra-cavity-pumped semiconductor disk laser (ICP-SDL) comprising:

forming a membrane external-cavity surface-emitting laser (MECSEL) comprising a MECSEL gain medium having a plane of the MECSEL gain medium that is orthogonal to a direction of a MECSEL resonator, bounded at a first resonator end by a first reflective member and at a second resonator end by a second reflective or partially reflective member; and forming an external pump laser resonator comprising a pump laser gain medium inside the external pump laser resonator bounded by a first external reflector and a second external reflector, wherein the MECSEL is arranged in the external pump laser resonator, wherein the external pump laser resonator is configured to optically pump the MECSEL, and wherein the external pump laser resonator is oriented so that the external pump laser resonator is not in the plane of the MECSEL gain medium.

12. The method of claim 11, wherein the external pump resonator is bounded at a first pump cavity end by a second reflective member and at a second pump cavity end by a third reflective member.

13. The method of claim 12, wherein the second reflective member is arranged outside and along a common axis to the MECSEL resonator.

14. The method of claim 11, wherein the external pump resonator is arranged at an angle to the MECSEL resonator.

15. The method of claim 11, wherein the external pump laser resonator is arranged at a common axis to the MECSEL resonator, wherein the first reflective member and the second reflective member are shared by the external pump laser resonator and the MECSEL resonator.

16. The method of claim 11, wherein a pump wavelength of a pump laser beam produced by the external pump laser resonator is determined based on MECSEL gain medium.

17. The method of claim 16, wherein the MECSEL gain medium comprises quantum wells, quantum dots, or bulk semiconductor material or alloy.

18. The method of claim 11, wherein the external pump laser resonator comprises a rare-earth doped solid state laser, an external-cavity laser, a semiconductor disk laser, or a gas laser.

19. The method of claim 18, wherein the external pump laser resonator comprises the rare-earth doped solid-state laser, and wherein the rare-earth doped solid state laser comprises a Nd:YAG, Yb:YAG, or a Nd:$YVO_4$.

20. The method of claim 11, wherein the external pump laser is configured to pump the MECSEL in an orientation where all a pump laser beam is orthogonal to the plane of the MECSEL gain medium.

* * * * *